US005296733A

United States Patent [19]
Kusano et al.

[11] Patent Number: 5,296,733
[45] Date of Patent: Mar. 22, 1994

[54] HETERO JUNCTION BIPOLAR TRANSISTOR WITH IMPROVED ELECTRODE WIRING CONTACT REGION

[75] Inventors: Chushiroh Kusano, Saitama; Hiroshi Masuda, Tokyo; Katsuhiko Mitani, Tokyo; Kazuhiro Mochizuki, Tokyo; Masaru Miyazaki, Tokyo; Masahiko Kawata, Tokyo; Susumu Takahashi, Tokyo, all of Japan

[73] Assignee: Hitachi, Ltd., Tokyo, Japan

[21] Appl. No.: 615,381

[22] Filed: Nov. 19, 1990

[30] Foreign Application Priority Data

Nov. 27, 1989 [JP] Japan ................................. 1-304814

[51] Int. Cl.⁵ ...................... H01L 29/72; H01L 29/06
[52] U.S. Cl. ...................................... 257/586; 257/565; 257/571; 257/584; 257/587; 257/618; 257/623
[58] Field of Search ..................... 357/34, 68, 71, 16, 357/34; 257/565, 571, 586, 587, 197, 584, 618, 623

[56] References Cited

U.S. PATENT DOCUMENTS

| 4,903,104 | 2/1990 | Kawai et al. | 357/34 |
| 4,958,208 | 9/1990 | Tanaka | 357/34 |
| 4,962,053 | 10/1990 | Spratt et al. | 357/34 |
| 4,999,693 | 3/1991 | Yamazaki et al. | 357/71 |
| 5,064,772 | 11/1991 | Jambotkar | 357/34 |

FOREIGN PATENT DOCUMENTS

| 0387010 | 9/1990 | European Pat. Off. | 357/34 |
| 90122345 | 4/1991 | European Pat. Off. | |
| 62-159464 | 7/1987 | Japan | |
| 63-004677 | 1/1988 | Japan | |
| 64-77167 | 3/1989 | Japan | 357/34 |

OTHER PUBLICATIONS

"Improved AlGaAs/GaAs HBT Performance by In-GaAs Emitter Cap Layer", K. Nagata et al., Electronics Letters, May 21, 1987, vol. 23, No. 11, pp. 566-568.

"High-Speed AlGaAs/GaAs HBTs with Proton-Implanted Buried Layers", O. Nakajima, International Electron Devices Meeting, Los Angeles, Calif., Dec. 7-10, 1986, pp. 266-269.

EP-A-240307, (Matsushita), p. 6, Col. 9, Lines 29-39.

"Heterostructure Devices using Self-Aligned p-Type Diffused Ohmic Contacts", S. Tiwari et al., IEEE Electron Device Letters, Aug. 1988, vol. 9, No. 8., pp. 422-424.

"Effect of Emitter-Base Spacing on the Current Garin of AlGaAs/GaAs Heterojunction Bipolar Transistors", W-S. Lee, IEEE Electron Device Letters, May 1989, vol. 10, No. 5, pp. 200-202.

"Low Resistance Refractory Ohmic Contact to p+ GaAs and p+ AlGaAs TLM Determination of p+ GaAs/p+ AlGaAs Contact Resistance", P. Rabinzohn et al., Ext. Abs. of the 20th Conf. on Solid State Devices and Materials, Aug. 24-26, 1988, pp. 287-290.

Primary Examiner—Andrew J. James
Assistant Examiner—Valencia M. Wallace
Attorney, Agent, or Firm—Kenyon & Kenyon

[57] ABSTRACT

A hetero junction bipolar transistor provides a contact area an area between an emitter (or collector) electrode and a wiring formed on the electrode that is larger than that of the emitter (or collector). A variation in voltage applied to an emitter (or collector)-base junctions is prevented and a stable operation of the transistor is attained. In addition, when an etching operation is carried out, an insulation film is formed on a side part of a mask. A patterning of the emitter (or collector) is then carried out and thus an emitter (or collector) having a size approximate to that of the mask is formed.

27 Claims, 2 Drawing Sheets

HETERO JUNCTION BIPOLAR TRANSISTOR WITH IMPROVED ELECTRODE WIRING CONTACT REGION

BACKGROUND OF THE INVENTION

1. Field of the Invention

This invention relates to a hetero junction bipolar transistor (hereinafter abbreviated as HBT) and its manufacturing method.

2 Description of the Related Art

In a prior art system, a spacing between each of the electrodes and a size of each of the electrodes has been made small to realize a high integration and a high operation speed of an HBT. Such an HBT has been made by a process described in Jap.Pat.Laid-Open No.-Sho 63-4677. That is, a first semiconductor layer acting as a collector, a second semiconductor layer acting as a base, a third semiconductor layer acting as an emitter, an emitter electrode film in ohmic contact with the third semiconductor layer and an insulation film are piled up in sequence on a substrate of the semiconductor. The insulation film is patterned to a predetermined shape. Thereafter this insulation film is used as a mask, and then the emitter electrode film and the third semiconductor layer are etched to expose the surface of the second semiconductor layer. Then, a first insulation side wall film is formed on the side walls of the emitter electrode layer. The third semiconductor layer is patterned to a predetermined shape. A base electrode film connected to the second semiconductor layer is formed on an entire surface. In addition, the second insulation side wall film is piled up on the side part of the base electrode film, this is used as a mask for etching an exposed portion of the electrode film. A bipolar transistor manufactured by this process shows an advantage that its base electrode is separated from the emitter electrode due to its self-alignment, so that an electrode size or a inter-electrode spacing is made minute thereby realizing a high integration of the elements and at the same time a reduction in its parasitic resistance or parasitic capacitance.

Jap.Pat.Laid-Open No.Sho 62-159464 describes a method for providing connecting portion of the emitter electrode and base electrode to the wiring on the non-active region arranged in the semiconductor substrate.

The prior art described in the aforesaid Jap.Pat.Laid-Open No.Sho 63-4677 has a disadvantage that a junction area has a large area due to no technical consideration on the connection between the emitter electrode and the wiring even though a fine emitter electrode, a fine emitter region and a short distance between the emitter region and the base region could be attained.

The prior art described in the aforesaid Jap.Pat.Laid-Open No.Sho 62-159464 was made such that some contact portions among the emitter electrode, base electrode and wirings are provided on the inactive semiconductor region and showed a problem in that an applied voltage to the emitter-base junction is non-unified due to a resistance of the emitter electrode. In addition, in forming the emitter region, a so-called side etching phenomenon is caused to etch in a lateral direction the semiconductor layer, from which the emitter is formed. The phenomenon presents a problem in forming a fine emitter size.

SUMMARY OF THE INVENTION

The present invention provides an HBT and a manufacturing method for such a device, in which the aforesaid problems of the prior art are eliminated and the emitter (or collector) region can be made to show a fine size without producing any non-uniform applied voltage to the emitter (or collector)-base junction.

The present invention also provides an HBT manufacturing method in which the emitter (or collector) can be formed with a high accuracy without the influence of side etching.

In order to accomplish these things, the present invention is made such that an area of the contact portion between an electrode formed on the emitter (or collector) and wirings formed on the electrode is made equal to or larger than that of the emitter (or collector).

As well-known in the art, in the case of the vertical bipolar transistor in particular, its normal mode operation is carried out such that carriers may flow from the upper part to the lower part. In this case, the uppermost part in the active region is an emitter, the lowermost part is a collector and then such a transistor as described above is called as an emitter-top type bipolar transistor. To the contrary, in case of the transistor showing an upward mode operation, the carriers may flow from the lower part to the upper part and in this case, the lowermost part of the active region is an emitter and the uppermost part is a collector. Such a transistor is called as a collector-top type bipolar transistor. In the present specification, the emitter-top type HBT will be described mainly in order to facilitate an understanding of it under its simplified description. Since the emitter-top type HBT and the collector-top type HBT are merely arranged while the vertical orientations of the emitter, base and collector are reversed to each other, a description relating to the emitter of the emitter-top type HBT may be applied to that of the collector of the collector-top type HBT as it is.

As described above, in the present invention, an area of a contact portion between the emitter electrode and the wiring is made equal to or larger than that of the emitter region, thereby a resistance of the emitter electrode is remarkably reduced, a voltage applied to the emitter-base junction is remarkably unified and a stable operation is realized. Such an effect as above is further improved by covering an entire surface of the emitter electrode with wiring.

In addition, in the case of the prior art HBT, as described above, the emitter electrode was formed in such a way as it could reach over the inactive region from over the emitter region and the connection with the wirings was carried out over the inactive region. However, such an arrangement showed a problem that an electric field applied to the emitter-base junction became non-uniform due to an increased resistance of the emitter electrode and this problem was remarkable as a width of the emitter electrode was made small.

In turn, in case of the present invention, the emitter electrode having approximately the same area as that of the emitter region is formed on the emitter region and further a wiring covering this emitter electrode is formed, resulting in that such a problem as above is not produced and an application of the electric field to the emitter-base junction is made more uniform than in the prior art.

There was a remarkable difference between the size of emitter pattern, made of an electrical conductive material, used as a mask and that of the emitter due to a side etching in forming the emitter. In the present invention, an insulation film is provided on a side wall of the emitter pattern and the emitter is formed by an etching process using this mask. Thus, influence caused by the side etching is restricted and then an emitter having a shape and a size which are quite similar to those of the emitter pattern can be formed.

The collector-top type HBT is processed in quite the same manner, a voltage applied to the collector-base junction is made uniform and it is apparent that a collector having the shape and size quite similar to those of the collector pattern.

DETAILED DESCRIPTION

A First Embodiment

Figure 1A:
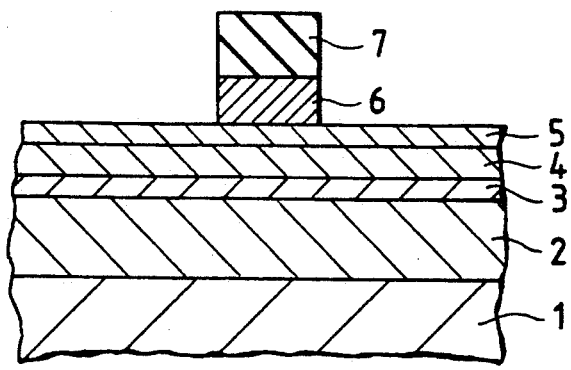
FIGS. 1a to 1d illustrate cross sectional views of a semiconductor device undergoing processing according to a first embodiment of the present invention.

FIGS. 1a to 1d illustrate one example of a manufacturing step for an HBT of the present invention. At first, as shown in FIG. 1a, an n-type GaAs 2 containing Si of about $5 \times 10^{18}$ cm$^{-3}$ doped is accumulated on a semi-insulative GaAs substrate so as to form a collector layer of a thickness of 0.8 μm. As a base layer, a p-type GaAs layer 3 with a thickness of about 1000 Å containing Be doped in about $3 \times 10^{19}$ cm$^{-3}$ is formed, and an n-type A$\iota$GaAs layer 4 with a thickness of about 1500 Å containing Si of about $5 \times 10^{17}$ cm$^{-3}$ (A$\iota$:30 atom %) is formed as an emitter layer, respectively. Lastly an n-type In$_x$Ga$_{1-x}$As layer 5 with a thickness of about 2000 Å containing doped Si of about $5 \times 10^{18}$ cm$^{-3}$ (x varies from 0 to 1 toward a surface of it) is formed as a cap layer in sequence and this is grown by a well-known MBE (Molecular Beam Epitaxial growth) process. Then, WSi is accumulated to show a thickness of about 8000 Å by a well-known sputtering process, a non-required part of WSi film is removed by an etching process with a photoresist mask 7 to form an emitter pattern 6. In place of WSi, Si$_3$N$_4$ may be accumulated.

Figure 1B:
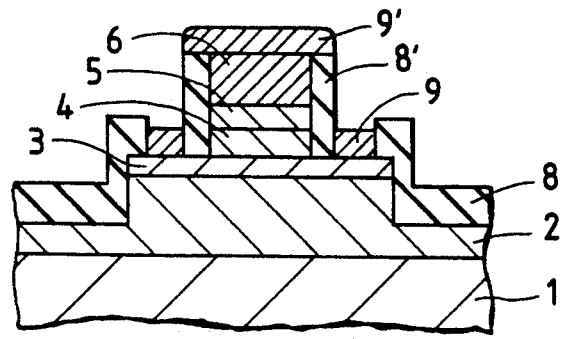

As shown in FIG. 1(b), an exposed part of the n-type GaAs layer 5 is etched by a reactive ion etching in CC$\iota_2$F$_2$ gas and inner gas (He) atmosphere with a mask of the emitter pattern 6, and an exposed part of the n-type A$\iota$GaAs layer 4 is etched by a chemical etching process, respectively.

After removing the emitter mask 7, a photoresist mask (not shown) for use in forming the base and the collector regions is provided, then, an exposed part of the p-type GaAs layer is removed by a reactive ion etching using CC$\iota_4$ as an etching gas so as to form the base region 3. This etching process is further continued and the exposed part of the n-type GaAs layer 2 is slightly etched to form the collector region 2. Then, a well-known CVD is applied to accumulate SiO$_2$ on an entire surface to form the insulation film 8 with a thickness of about 3000 Å. After this formation a well-known photoetching is applied to form the contact hole through the SiO$_2$ film 8 for use in connecting the base electrode. As this etching, a reactive ion etching using mixed gas of CHF$_3$ and C$_2$F$_6$ was applied. With such a process, as shown in FIG. 1b, an insulating film side wall 8' around the emitter pattern 6 and a pattern of an insulation film 8 are left. Subsequently, a base electrode 9 composed of AuZn alloy was formed by a well-known vapor deposition and a lift-off technique, and an ohmic contact was achieved between them through a heat treatment in nitrogen atmosphere (400° C., 2 minutes). At this time, AuZn alloy film 9' was formed also on the emitter pattern 6.

Figure 1C:
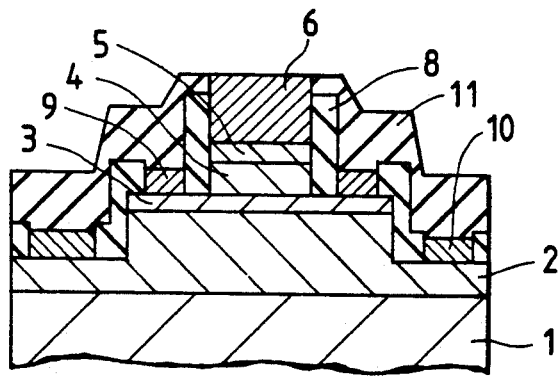

Then, the photoresist was coated entirely on the surface in thickness form to flatten the surface. Thereafter a dry etching process was carried out on the entire surface at an approximate same etching speed to cause a surface of an AuZn alloy film 9' formed on the emitter pattern 6 to be exposed and the AuZn alloy film 9' was etched by the well-known ion-milling process and removed. As shown in FIG. 1c, the collector electrode 10 composed of AuGe alloy was formed by a well-known vapor deposition and the lift-off technique. The insulation film 11 was formed on an entire surface. The insulation film 11, made of spin-on-glass (SOG) is held between the two SiO$_2$ films formed by a CVD process to form a sandwich structure and a total film thickness is about 6000 Å.

Figure 1D:
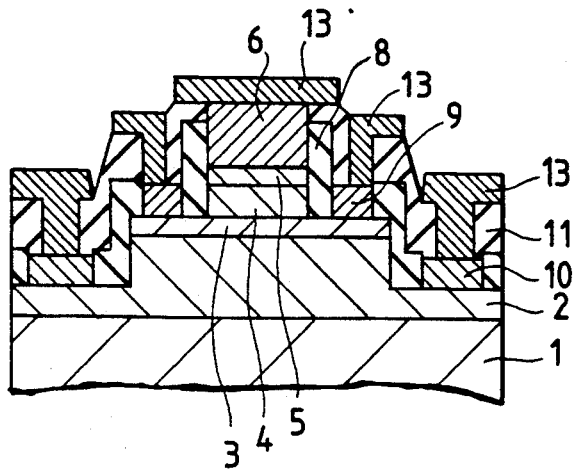

A well-known photoetching process is applied to form an opening at a predetermined part of the insulation film 11 through which the surface of the emitter pattern 6 is exposed. As shown in FIG. 1d, an insulation film 11, formed on the base electrode 9 and the collector electrode 10, is respectively removed by the photoetching process to form a contact hole. Thereafter an electrical conductive film containing Au as major constituent is formed on an entire surface by a well-known vapor depositing process. A non-required part of it is removed by a well-known photoetching process using an ion-milling together with a photoresist mask and then wirings are formed. At this time, all the upper surface of the emitter pattern 6 are covered by the wirings 13. The emitter pattern 6 is made of electrical conductive material and it is apparent that it may act as an emitter electrode.

As is apparent from FIG. 1d, the HBT formed in this embodiment is made such that the emitter electrode 6 is formed equal or larger at least than the emitter region 5. In addition, an area of a contact portion between the emitter electrode 6 and the wiring 13 is larger than that of the emitter region 5. Due to this fact, it was possible to perform a stable application of a voltage to an emitter-base junction. Further, a thin thickness of the insulation film 8 formed on the sides of the emitter regions 4 and 5 enabled a base parasitic resistance to be reduced.

In the preferred embodiment, a so-called emitter-top type HBT in which the emitter region is placed over the collector and base regions has been described. Similar to the above arrangement, an n-type GaAs layer, an n-type A$\iota$GaAs layer acting as an emitter layer, a p-type GaAs layer acting as a base layer and an n-type GaAs layer acting as a collector layer were piled up in this sequence on the substrate and subsequently they were processed substantially in the same manner as above to form a collector-top type HBT and it was recognized to have a substantial similar effect as that of the aforesaid emitter top type HBT.

A Second Embodiment

Figure 2A:
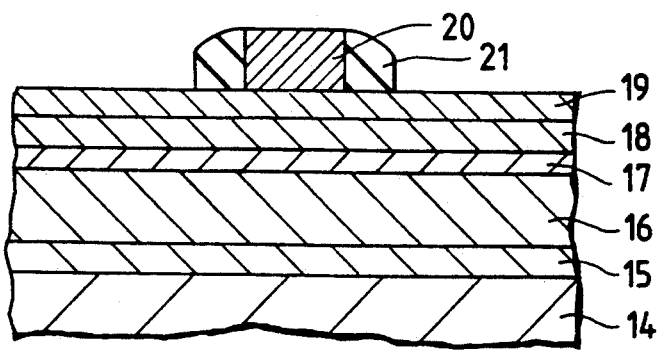
FIGS. 2a to 2d illustrate a series of cross sectional views of a semiconductor device undergoing processing according to a second embodiment of the present invention.

FIGS. 2a to 2d illustrate steps for showing another preferred embodiment of the present invention. At first, as shown in FIG. 2a, on the semi-insulative InP substrate 14 were formed an n-type InGaAs layer (a collector layer) 15 with a thickness of about 3000 Å containing Si doped in an n-type dopant of $2\times10^{19}$ cm$^{-3}$, an n-type InGaAs layer 16 with a thickness of about 5000 Å containing Si doped in $1\times10^{16}$ cm$^{-3}$, a p-type InGaAs layer (a base layer) 17 with a thickness of about 500 Å containing Be coped in $1\times10^{20}$ cm$^{-3}$, an n-type InAlAs layer (an emitter layer) 18 with a thickness of 2000 Å containing Si doped in $5\times10^{17}$ cm$^{-3}$ and an n-type InGaAs layer (a cap layer) 19 with a thickness of 2000 Å containing Si doped in $2\times10^{19}$ cm$^{-3}$ by MOCVD process in sequence. Then, WSi layer with a film thickness of about 8000 Å is formed by applying the well-known sputtering process and the emitter pattern 20 is formed by using a photoetching with a photoresist mask. SiO$_2$ film is formed on an entire surface by applying the well-known CVD, the entire surface of SiO$_2$ film is anisotropically etched, SiO$_2$ film formed on a flat surface part is removed and only SiO$_2$ film 21 formed on the side part of the emitter pattern 20 is left. A thickness of SiO$_2$ film left on the side part is about 4000 Å which is about the same as a total thickness of an n-type InGaAs layer 19 and an n-type InAlAs layer 18 to be etched in the next step.

Figure 2B:
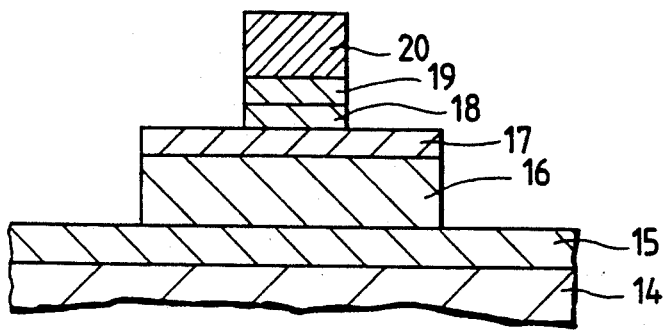

Then, as shown in FIG. 2b, by using the emitter pattern 20 and SiO$_2$ layer 21 formed on the side part of the emitter pattern as masks, an exposed portion of the n-type InGaAs layer 19 is etched by a reactive ion etching, using and a gas of Cl as etching gas, and another exposed portion of the n-type InAlAs layer 18 is etched by a chemical etching process, respectively, and thereby, the p-type InGaAs layer 17 is exposed. The SiO$_2$ layer 21 is removed by the chemical etching. The exposed portions of the p-type InGaAs layer 17 and the n-type InGaAs layer 16 are removed by using the well-known photoetching technique with a photoresist mask (not shown) to expose the n-type InGaAs layer 15, and then the photoresist mask is removed.

Figure 2C:
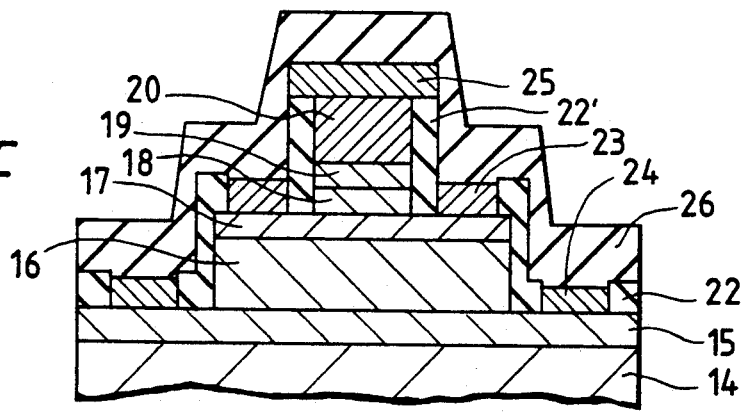

Then, as shown in FIG. 2c, SiO$_2$ film 22 with a thickness of about 3000 Å is accumulated on an entire surface by the CVD process in the same manner as that of the first embodiment. Thereafter the portions of the SiO$_2$ film 22 where the base, collector and emitter electrodes are provided are etched by the reactive ion etching using mixed gas of CHF$_3$ and C$_2$F$_6$ as the etching gas so as to form holes in the SiO$_2$ film 22. At this time, the SiO$_2$ film 22 formed on the emitter pattern 20 is completely removed and the upper surface of the emitter pattern 20 is exposed so that, as shown in FIG. 2c, the emitter pattern 20, the SiO$_2$ film 22' on the sides of the emitters 19 and 18 and the SiO$_2$ film 22 formed on the other portion are left so as to form the contact holes of the emitter, base and collector. A stacked film of Mo film and Au film is entirely deposited, thereafter the non-required portion is removed by the well-known lift-off process so as to form the base electrode 23, collector electrode 24 and emitter electrode 25. An inter dielectric film 26 having a thickness of 0.6 μm composed of the SiO$_2$ film made by the CVD process and of the SOG film was formed over the entirety of the top surface of the device.

Figure 2D:
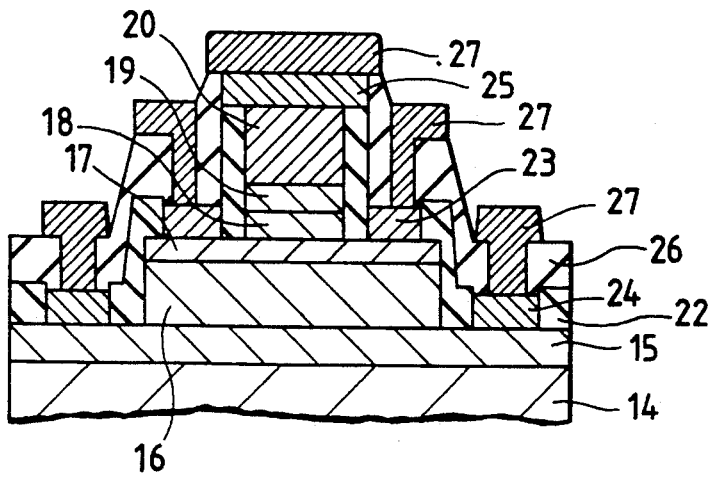

As shown in FIG. 2d, holes are formed in the inter dielectric film 26 by using well-known photoetching processes, and the surfaces of the emitter, base and collector electrodes 25, 23 and 24 are exposed. In addition, a multi-layer film composed of Mo layer and Au layer is entirely formed by a vapor deposition. Non-required portions are removed by the well-known photo-etching process using the ion-milling so as to form the wiring 27. In forming holes in the inter dielectric film 26, the upper surface of the emitter electrode 25 is completely exposed and a contact area between the wiring 27 and the emitter electrode 25 is larger than at least an area of the emitter pattern 20.

In this embodiment, it is possible to use the emitter pattern 20 composed of WSi as an emitter electrode and it has an advantage of enabling a quite simplified step to be attained. Due to a thickness of the SiO$_2$ film 21 formed on the side part of the emitter pattern 20 in FIG. 2a, it is possible to reduce an influence caused by the side etching produced in performing an etching of the semiconductor layer and it may provide an advantage of facilitating a fine emitter size. The element of the preferred embodiment of the present invention enabled a stable application of the voltage to the emitter-base junction.

As apparent from the aforesaid description, according to the present invention, even if the size of the emitter (or collector) is made quite small, it becomes possible to provide a more stable application of voltage to the emitter-base junction (or the collector-base junction) than that of the prior art HBT and thus this effect can be realized by HBT capable of performing a very stable operation.

In addition, it becomes possible to restrict an influence of the side etching when the emitter (or collector) is formed and the emitter (or collector) having approximate same shape and size as those of the emitter (or collector) pattern. Due to this fact, a disturbance of the characteristics in each of the HBTs becomes low and it becomes possible to easily form the HBTs having consistent characteristics.

What is claimed is:

1. A hereto junction bipolar transistor comprising:
   a semi-insulative compound semiconductor substrate;
   a first compound semiconductor layer having a first conductivity type formed on said semi-insulative compound semiconductor substrate;
   a second compound semiconductor layer having a second conductivity type opposite to said first conductivity type formed on a top surface of said first compound semiconductor layer and having a predetermined shape;
   a third compound semiconductor layer having said first conductivity type formed on a top surface of said second compound semiconductor layer and having a desired shape and composed of material differing from that of said second compound semiconductor layer;
   a fourth compound semiconductor layer having said first conductivity type formed on a top surface of said third compound semiconductor layer and having a desired shape and composed of material differing from that of said third compound semiconductor layer;
   an emitter pattern of conductive material formed on a top surface of said fourth compound semiconductor layer;
   an electrode formed on a top surface of said emitter pattern;
   a wiring formed on a top surface of said electrode; and
   an insulating film being disposed along side surfaces of said third compound semiconductor layer, said fourth compound semiconductor layer and said emitter pattern, wherein said side surfaces of said third compound semiconductor layer, said fourth compound semiconductor layer, and said emitter pattern are substantially coplanar and wherein an area of contact between said top surface of said electrode and said wiring is equal to or larger than area of said top surface of said fourth compound semiconductor layer.

2. A hetero junction bipolar transistor according to claim 1 wherein an entire top surface of said electrode is covered by said wiring.

3. A hetero junction bipolar transistor according to claim 1 wherein said hetero junction bipolar transistor is an emitter-top type hetero junction bipolar transistor.

4. A hetero junction bipolar transistor according to claim 3 wherein said first compound semiconductor layer is a collector, said second compound semiconductor layer is a base and said third and fourth compound semiconductor layers are emitters.

5. A hetero junction bipolar transistor according to claim 3 wherein said first and second conductivity types are n-type and p-type, respectively.

6. A hetero junction bipolar transistor according to claim 3 wherein said first, second and fourth compound semiconductor layers comprise GaAs.

7. A hetero junction bipolar transistor according to claim 3 wherein said third compound semiconductor layer comprises GaAlAs.

8. A hetero junction bipolar transistor according to claim 3 wherein a top surface area of said third compound semiconductor layer and a top surface area of said fourth compound semiconductor layer are smaller than an area of said second compound semiconductor layer.

9. A hetero junction bipolar transistor according to claim 4 wherein an insulation film is disposed along a side wall of said emitter and a second electrode in contact with said insulation film is formed on a portion of a top surface of said base.

10. A hetero junction bipolar transistor according to claim 4 wherein said collector has a mesa portion and a lower part adjacent to this mesa portion, said base is formed on said mesa portion and a third electrode is formed on said lower portion, respectively.

11. A hetero junction bipolar transistor according to claim 1 wherein a lower resistive fifth compound semiconductor layer is disposed between said first compound semiconductor layer and said compound semiconductor substrate.

12. A hetero junction bipolar transistor according to claim 11 wherein an entire top surface of said electrode is covered by said wiring.

13. A hetero junction bipolar transistor according to claim 11 wherein said hetero junction bipolar transistor is an emitter-top type hetero junction bipolar transistor.

14. A hetero junction bipolar transistor according to claim 13 wherein said first compound semiconductor layer is a collector, said second compound semiconductor layer is a base and said third and fourth compound semiconductor layers are emitters.

15. A hetero junction bipolar transistor according to claim 13 wherein said first and second conductivity types are an n-type and a p-type, respectively.

16. A hetero junction bipolar transistor according to claim 14 wherein a low resistance layer is interposed between said emitter and said electrode.

17. A hetero junction bipolar transistor comprising:
a semi-insulative compound semiconductor substrate;

a first compound semiconductor layer having a first conductivity type formed on said semi-insulative semiconductor substrate;

a second compound semiconductor layer having said first conductivity type formed on a top surface of said first compound semiconductor layer and made of the same material as that of said first compound semiconductor layer;

a third compound semiconductor layer having a second conductivity type opposite to said first conductivity type formed on a top surface of said second compound semiconductor layer and having a desired shape and composed of the same material as that of said second compound semiconductor layer;

a fourth compound semiconductor layer formed on a top surface of said third compound semiconductor layer, having said first conductivity type and having a desired shape and composed of a material differing from that of said third compound semiconductor layer;

a fifth compound semiconductor layer formed on a top surface of said fourth compound semiconductor layer, having said first conductivity type and having a desired shape and composed of a material differing from that of said fourth compound semiconductor layer;

an electrode formed on a top surface of said fifth compound semiconductor layer;

a wiring formed on said electrode; and an insulating film being disposed along side surfaces of said third compound semiconductor layer, said fourth compound semiconductor layer, and said fifth semiconductor layer wherein said third compound semiconductor layer, said fourth compound semiconductor layer, and said fifth compound semiconductor layer are substantially co-planar and wherein an area of a contact between said top surface of electrode and said wiring is larger than an area of said top surface of said fourth compound semiconductor layer.

18. A hetero junction bipolar transistor according to claim 17 wherein entire area of said top surface of said electrode is covered by said wiring.

19. A hetero junction bipolar transistor according to claim 17 in which said hetero junction bipolar transistor is a collector-top type hetero junction bipolar transistor.

20. A hetero junction bipolar transistor according to claim 19 wherein said first and second compound semiconductor layers are emitters, said third compound semiconductor layer is a base and said fourth compound semiconductor layer is a collector.

21. A hetero junction bipolar transistor comprising:
a compound semiconductor substrate;

a compound semiconductor collector layer having a first conductivity type formed on a top surface of said substrate;

a compound semiconductor base layer having a second conductivity type opposite to said first conductivity type formed on a top surface of said collector layer;

a compound semiconductor emitter layer having said first conductivity type formed on said top surface of said base layer;

an compound semiconductor emitter cap layer having said first conductivity type formed on top surface of said emitter layer;

an emitter pattern layer of conductive material formed on top surface of said emitter cap layer;

an emitter electrode formed on said emitter pattern layer; a wiring layer electrically connected with said emitter electrode; and a side-wall insulating layer being formed along side surfaces of said emitter layer, emitter cap layer and emitter pattern layer, wherein said side surfaces of said emitter layer, said emitter cap layer, and said emitter pattern layer are substantially co-planer, and wherein an area of contact between said top surface of said electrode and said wiring is equal to or larger than that of said top surface of said emitter cap layer.

22. A hetero junction bipolar transistor according to claim 21 wherein said first and second conductivity types are n-type and p-type, respectively.

23. A hetero junction bipolar transistor according to claim 21 wherein upper edge of said side-wall insulating layer being lower than top surface of said emitter pattern layer.

24. A hetero junction bipolar transistor according to claim 21 wherein the heights of upper edge of said side-wall insulating layer and top surface of said emitter pattern layer are substantially equal and said emitter electrode being formed on top surface of said emitter pattern layer and upper side edge of said side-wall insulating layer.

25. A hetero junction bipolar transistor according to claim 21 wherein said emitter pattern layer comprises W-Si.

26. A hereto junction bipolar transistor comprising:
a semi-insulative compound semiconductor substrate;
a first compound semiconductor layer having a first conductivity type formed on said semi-insulative compound semiconductor substrate;
a second compound semiconductor layer having a second conductivity type opposite to said first conductivity type formed on a top surface of said first compound semiconductor layer and having a predetermined shape;
a third compound semiconductor layer having said first conductivity type formed on a top surface of said second compound semiconductor layer and having a desired shape and composed of material differing from that of said second compound semiconductor layer;
a fourth compound semiconductor layer having said first conductivity type formed on a top surface of said third compound semiconductor layer and having a desired shape and composed of material differing from that of said third compound semiconductor layer;

an emitter pattern of conductive material formed on a top surface of said fourth compound semiconductor layer;

an electrode formed on a top surface of said emitter pattern; and a wiring formed on a top surface of said electrode;

wherein an area of contact between said top surface of said electrode and said wiring is equal to or larger than area of said top surface of said fourth compound semiconductor layer.

27. A hetero junction bipolar transistor comprising:
a semi-insulative compound semiconductor substrate;
a first compound semiconductor layer having a first conductivity type formed on said semi-insulative semiconductor substrate;
a second compound semiconductor layer having said first conductivity type formed on a top surface of said first compound semiconductor layer and made of the same material as that of said first compound semiconductor layer;
a third compound semiconductor layer having a second conductivity type opposite to said first conductivity type formed on a top surface of said second compound semiconductor layer and having a desired shape and composed of the same material as that of said second compound semiconductor layer;
a fourth compound semiconductor layer formed on a top surface of said third compound semiconductor layer, having said first conductivity type and having a desired shape and composed of a material differing from that of said third compound semiconductor layer;
a fifth compound semiconductor layer formed on a top surface of said fourth compound semiconductor layer, having said first conductivity type and having a desired shape and composed of a material differing from that of said fourth compound semiconductor layer;
an electrode formed on a top surface of said fifth compound semiconductor layer; and
a wiring formed on said electrode;
wherein an area of a contact between said top surface of electrode and said wiring is larger than an area of said top surface of said fourth compound semiconductor layer.

* * * * *

UNITED STATES PATENT AND TRADEMARK OFFICE
CERTIFICATE OF CORRECTION

PATENT NO. : 5,296,733
DATED : 22 March 1994
INVENTOR(S) : Chushiroh Kusano et al It is certified that error appears in the above-indentified patent and that said Letters Patent is hereby corrected as shown below:

Title Page:
IN THE ABSTRACT, line 2: After "area" delete "an area".

| Column | Line | |
|---|---|---|
| 1 | 15 | After "small" insert --in order--. |
| 1 | 67 | Change "The" to --This--. |
| 4 | | Delete "The" and insert --Thereafter the--. |
| 5 | 7 | Change "coped" to --doped--. |
| 6 | 36 | Change "hereto" to --hetero--. |
| 8 | 34 | After "fifth" insert "compound". |
| 8 | 66 | Change "an" to --a--. |
| 9 | 21 | Change "being" to --is--. |

Signed and Sealed this

Twentieth Day of September, 1994

Attest:

BRUCE LEHMAN

*Attesting Officer*　　　*Commissioner of Patents and Trademarks*